US012092960B2

(12) United States Patent
Luo et al.

(10) Patent No.: US 12,092,960 B2
(45) Date of Patent: Sep. 17, 2024

(54) MASK TOPOLOGY OPTIMIZATION METHOD AND SYSTEM FOR SURFACE PLASMON NEAR-FIELD PHOTOLITHOGRAPHY

(71) Applicant: THE INSTITUTE OF OPTICS AND ELECTRONICS, THE CHINESE ACADEMY OF SCIENCES, Sichuan (CN)

(72) Inventors: Xiangang Luo, Sichuan (CN); Mingfeng Xu, Sichuan (CN); Mingbo Pu, Sichuan (CN); Di Sang, Sichuan (CN); Xiaoliang Ma, Sichuan (CN); Xiong Li, Sichuan (CN); Ping Gao, Sichuan (CN); Zeyu Zhao, Sichuan (CN)

(73) Assignee: THE INSTITUTE OF OPTICS AND ELECTRONICS, THE CHINESE ACADEMY OF SCIENCES, Sichuan (CN)

( * ) Notice: Subject to any disclaimer, the term of this patent is extended or adjusted under 35 U.S.C. 154(b) by 0 days.

(21) Appl. No.: 18/575,532

(22) PCT Filed: Oct. 14, 2021

(86) PCT No.: PCT/CN2021/123793
§ 371 (c)(1),
(2) Date: Dec. 29, 2023

(87) PCT Pub. No.: WO2023/060505
PCT Pub. Date: Apr. 20, 2023

(65) Prior Publication Data
US 2024/0264535 A1    Aug. 8, 2024

(51) Int. Cl.
*G03F 7/00* (2006.01)
*G03F 1/36* (2012.01)

(52) U.S. Cl.
CPC .......... *G03F 7/70433* (2013.01); *G03F 1/36* (2013.01); *G03F 7/705* (2013.01)

(58) Field of Classification Search
CPC ......... G03F 7/70433; G03F 1/36; G03F 7/705
See application file for complete search history.

(56) References Cited

U.S. PATENT DOCUMENTS 10,725,373 B1    7/2020  Kumar et al.
2022/0100935 A1*  3/2022  Chen ................. G03F 7/705

FOREIGN PATENT DOCUMENTS

| CN | 104635434 A | 5/2015 |
| CN | 108535952 A | 9/2018 |
| CN | 110678961 A | 1/2020 |

OTHER PUBLICATIONS

WIPO/ISA/CNIPA, "International Search Report and Written Opinion" issued on Jul. 7, 2022 in PCT/CN2021/123793, 6 pages.

* cited by examiner

*Primary Examiner* — Sean M DeGuire
*Assistant Examiner* — Jayson D Cosgrove
(74) *Attorney, Agent, or Firm* — J. Peter Paredes; Amin Wasserman Gurnani LLP

(57) ABSTRACT

A mask topology optimization method for surface plasmon near-field photolithography, including: acquiring first mask data and performing fuzzy processing and projection processing on same to obtain second mask data; performing forward calculation according to the second mask data and a preset surface plasmon near-field photolithography condition to obtain imaging data and forward field data; calculating an imaging error between the imaging data and expected imaging data; performing adjoint calculation on the second mask data to obtain adjoint field data; calculating a gradient matrix of the imaging error relative to the first mask data according to the forward field data and the adjoint (Continued)

field data; and updating the first mask data according to the gradient matrix, repeating the steps for iteration calculation until the optimized mask data is obtained, and outputting a final mask pattern.

13 Claims, 13 Drawing Sheets

MASK TOPOLOGY OPTIMIZATION METHOD AND SYSTEM FOR SURFACE PLASMON NEAR-FIELD PHOTOLITHOGRAPHY

CROSS-REFERENCE TO RELATED APPLICATIONS

The present application claims priority to PCT application serial no. PCT/CN2021/123793 filed Oct. 14, 2021, herein incorporated by reference in their entirety.

TECHNICAL FIELD

The present disclosure relates to the field of integrated circuit technologies, and specifically to a mask topology optimization method and system for Surface Plasmon near-field Lithography (SPL).

BACKGROUND

In the fabrication of modern complex microelectronic integrated circuits, it is necessary to design a mask pattern of the integrated circuit and then transfer the mask pattern to a semiconductor chip by lithography technology. The mainstream lithography system at present is a 193 nm deep ultraviolet (DUV) lithography system, and surface plasmon near-field imaging lithography has the advantages of high throughput, high resolution, high aspect ratio, high fidelity, one-step exposure and the like, and is a potential technical solution for replacing a complex and expensive modern projection lithography technology.

Meanwhile, image fidelity in lithography must be tightly controlled during fabrication of integrated circuit to improve the performance, efficiency, and yield of semiconductor devices. However, exposure transfer processing of complex mask patterns integrated at high density exhibits poor contrast, poor fidelity, and non-uniformity. In order to improve the resolution and imaging fidelity of the lithography system, inverse lithography technology (ILT), especially optical proximity-effect correction (OPC), is widely used to compensate for image distortion caused by adverse effects such as optical proximity effect, stray light effect, and mask shadow effect through changing pattern of the mask Due to a nonlinear imaging model and a nonlinear photoresist effect, the conventional OPC method is difficult to be applied to the surface plasmon near-field lithography with a sub-wavelength electromagnetic structure.

Therefore, those skilled in the art are in urgent need of an efficient, fast and low-cost optical proximity effect compensation method to adjust and compensate for the target pattern, so as to meet the requirement of area error and improve the yield of the product. The pixel-based reverse lithography technology can effectively increase the degree of freedom in optimization, but at the same time, the huge variable throughput brings significant challenges to computational complexity and increases the running time of pattern optimization.

SUMMARY

(1). Technical Problems to be Resolved

In view of the above problems, the present disclosure provides a mask topology optimization method and system for surface plasmon near-field photolithography, which are used to at least partially solve technical problems of how to perform the optical proximity effect compensation in the surface plasmon near-field photolithography.

(2). Technical Solutions

According to one aspect of the present disclosure, provided is a mask topology optimization method for surface plasmon near-field photolithography, including: acquiring a first mask data and performing fuzzy processing and projection processing on the same to obtain a second mask data; performing forward calculation according to the second mask data and a preset surface plasmon near-field photolithography condition to obtain an imaging data and a forward field data; calculating an imaging error between the imaging data and an expected imaging data; performing adjoint calculation on the second mask data to obtain an adjoint field data; calculating a gradient matrix of the imaging error relative to the first mask data according to the forward field data and the adjoint field data; and updating the first mask data according to the gradient matrix, repeating the above steps for iteration calculation until the optimized mask data is obtained, and outputting a final mask pattern.

Further, the calculating an imaging error between the imaging data and expected imaging data includes: determining whether the imaging error is less than a threshold or whether a current accumulated iteration number is greater than a set value, wherein if yes, the current mask data is output as the optimized mask data; otherwise, the iteration calculation is continued.

Further, the performing forward calculation includes: simulating by using an exposure light source excitation source; and solving by using a finite-difference time-domain algorithm to obtain the imaging data and the forward field data.

Further, the performing adjoint calculation includes: simulating by using an adjoint excitation source; and solving by using a finite-difference time-domain algorithm to obtain the adjoint field data.

Further, the acquiring first mask data includes: acquiring an initial mask pattern based on an expected imaging pattern; performing pixelization processing on the initial mask pattern to obtain an initial mask data and an expected imaging data; and taking the initial mask data or an updated mask data as the first mask data to perform the fuzzy processing and the projection processing.

Further, the fuzzy processing includes:

performing the fuzzy processing by using the following formula:

$$\tilde{\rho}(r) = \sum_{r_j} \frac{1}{\alpha} \rho(r) B(r, r_j)$$

where $\alpha = \Sigma_{r_j} B(r, r_j)$, $B(r, r_j) = \max\{0, R_{filt} - \|r - r_j\|\}$, $R_{filt}$ is a fuzzy radius, $\rho(r)$ is the initial mask data or the updated mask data, i.e., the first mask data, $\tilde{\rho}(r)$ is the mask data after the fuzzy processing, r is coordinates of any point in the current mask data, and $\Sigma_{r_j}$ represents the summation at the r coordinate by traversing all coordinate points $r_j$ in the current mask data.

Further, the projection processing includes:

performing binarization projection processing by using the following formula:

$$\overline{p}(r) = \begin{cases} \eta e^{\frac{\beta(\eta - \tilde{p}(r))}{\eta}} - (\eta - \tilde{p}(r))e^{-\beta}, & 0 \le \tilde{p}(r) \le \eta \\ 1 - (1 - \eta)e^{\frac{\beta(\tilde{p}(r) - \eta)}{\eta}} - (\eta - \tilde{p}(r))e^{-\beta}, & \eta < \tilde{p}(r) \le 1 \end{cases}$$

where $\beta$ is a binarized parameter, $\eta$ is a binarized threshold, $\tilde{p}(r)$ is the mask data after the fuzzy processing, and $\overline{p}(r)$ is mask after the projection processing, i.e., the second mask data.

Further, the calculating an imaging error between the imaging data and expected imaging data includes:

calculating the imaging error by using the following formula:

$$F = \sum |P_a(x, y) - P_d(x, y)|^2 / (m \times n) \times 100\%$$

where $P_a(x, y)$ is the imaging data corresponding to the current mask data under the preset surface plasmon near-field photolithography condition, $P_d(x, y)$ is the expected imaging data, $(x, y)$ is coordinate in the imaging data, and m and n are numbers of sampling points in x and y directions corresponding to the imaging data.

Further, the calculating a gradient matrix of the imaging error relative to the first mask data according to the forward field data and the adjoint field data includes:

calculating the gradient matrix by using the following formula:

$$G(r) = \partial F / \partial \rho(r) = n(r)Re\{E_{for}(r) \cdot E_{adj}(r)\}$$

where $G(r)$ is the gradient matrix, $n(r)$ is refractive index distribution of the current mask data, $E_{for}(r)$ is the forward field data, and $E_{adj}(r)$ is the adjoint field data.

Further, the updating the first mask data according to the gradient matrix includes:

calculating the updated mask data by using the following formula:

$$\rho^{k+1}(r) = \rho^k(r) + s \cdot G(r)$$

where s is a preset optimization step size, $\rho^k(r)$ is the current mask data, $\rho^{k+1}(r)$ is the updated mask data, $G(r)$ is the gradient matrix, and k is a current iteration number, where all pixel values of the updated mask data are limited to the range of [0, 1], where pixel values greater than 1 are set to 1, pixel values less than 0 are set to 0, and pixel values in the range of [0, 1] are kept unchanged.

Further, the outputting a final mask pattern includes: outputting the current mask data as the optimized mask data, extracting an edge of the optimized mask data by using an edge smoothing method and removing pixelated jaggy, then outputting the final mask pattern, where the output optimized mask data is the current second mask data.

The present disclosure further provides, in another aspect, a method for surface plasmon near-field photolithography, including: acquiring a first mask data, and performing fuzzy processing and projection processing on the first mask data to obtain a second mask data; performing forward calculation according to the second mask data and a preset surface plasmon near-field photolithography condition to obtain an imaging data and forward a field data; calculating an imaging error between the imaging data and an expected imaging data; performing adjoint calculation on the second mask data to obtain an adjoint field data; calculating a gradient matrix of the imaging error relative to the first mask data according to the forward field data and the adjoint field data; updating the first mask data according to the gradient matrix, repeating the above steps for iteration calculation until the optimized mask data is obtained, and outputting a final mask pattern; and performing the surface plasmon near-field photolithography according to the final mask pattern.

The present disclosure further provides, in still another aspect, a mask topology optimization system for surface plasmon near-field photolithography, including: a mask processing module, configured to acquire a first mask data and perform fuzzy processing and projection processing on the same to obtain a second mask data; an acquisition module, configured to perform forward calculation according to the second mask data and a preset surface plasmon near-field photolithography condition to obtain an imaging data and a forward field data; an imaging error calculation module, configured to calculate an imaging error between the imaging data and an expected imaging data; an adjoint field data calculation module, configured to perform an adjoint calculation on the second mask data to obtain adjoint field data; a gradient matrix calculation module, configured to calculate a gradient matrix of the imaging error relative to the first mask data according to the forward field data and the adjoint field data; and an iteration calculation module, configured to update the first mask data according to the gradient matrix, repeating the above steps for iteration calculation until the optimized mask data is obtained, and output a final mask pattern.

The present disclosure further provides, in yet another aspect, an electronic device, including: a memory, a processor, and a computer program stored on the memory and executable on the processor, wherein the program, when executed by the processor, causes the processor to perform the mask topology optimization method for surface plasmon near-field photolithography described above.

The present disclosure further provides, in yet another aspect, a computer-readable storage medium having a computer program stored thereon, wherein the computer program, when executed by a processor, implements the mask topology optimization method for surface plasmon near-field photolithography described above.

The present disclosure further provides, in yet another aspect, a computer program product including a computer program, wherein the computer program, when executed by a processor, implements the mask topology optimization method for surface plasmon near-field photolithography described above.

(3). Beneficial Effects

According to the mask topology optimization method and system for surface plasmon near-field photolithography provided by the present disclosure, the adjoint calculation is introduced based on the forward calculation, and the optimized gradient is obtained and the mask topology form is adjusted and compensated, so that the imaging fidelity and the yield of the product are improved, the problem of distortion of the existing near-field photolithography pattern can be solved, and the strong coupling phenomenon in the sub-wavelength electromagnetic structure such as the optical proximity effect, the stray light effect and the mask shadow effect can be compensated. In the mask optimization process in the present disclosure, the micro structures that are smaller than the set threshold and cannot be machined are fuzzily filtered, the minimum size of any part of the mask pattern is ensured to be greater than or equal to the set threshold, and the mask feature size is ensured to meet the manufacturability constraint condition; and the manufacturability of the mask is further improved by correcting for edge jaggy in the pixelated mask pattern that cannot be manufactured.

BRIEF DESCRIPTION OF DRAWINGS

For a more complete understanding of the present disclosure and the advantages thereof, reference is now made to the following descriptions taken in conjunction with the accompanying drawings, in which.

DETAILED DESCRIPTION OF EMBODIMENTS

Figure 1:
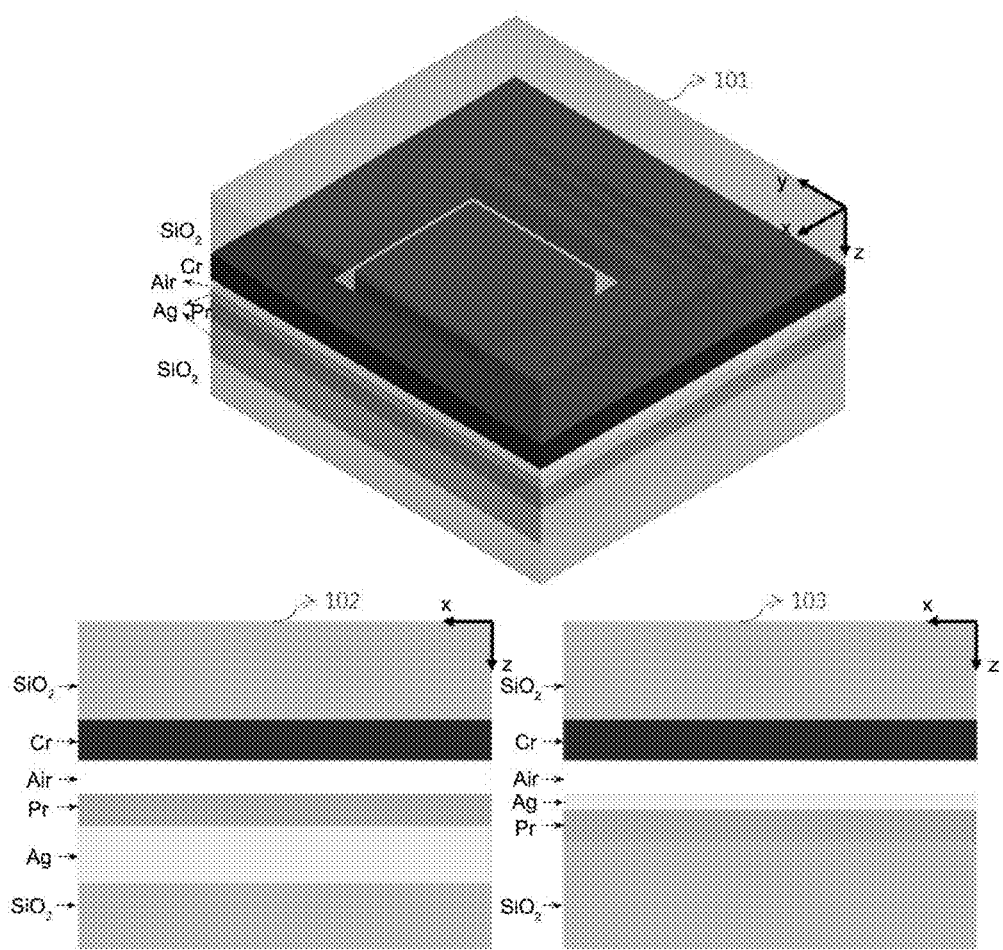
FIG. 1 schematically shows a schematic diagram of an application scenario of a mask topology optimization method for surface plasmon near-field photolithography according to an embodiment of the present disclosure.

Hereinafter, embodiments of the present disclosure will be described with reference to the accompanying drawings. However, it should be understood that these descriptions are illustrative only and are not intended to limit the scope of the present disclosure. In the following detailed description, for purposes of explanation, numerous specific details are set forth in order to provide a thorough understanding of the embodiments of the present disclosure. It will be apparent, however, that one or more embodiments may be practiced without these specific details. Moreover, in the following description, descriptions of well-known structures and techniques are omitted so as to not unnecessarily obscure the concepts of the present disclosure.

The terminology used herein is for the purpose of describing specific embodiments only and is not intended to be limiting to the present disclosure. The terms "comprise", "contain", and the like, as used herein, specify the presence of stated features, steps, operations, and/or components, but do not preclude the presence or addition of one or more other features, steps, operations, or components.

All terms (including technical and scientific terms) used herein have the same meaning as commonly understood by those of ordinary skill in the art, unless otherwise defined. It should be noted that the terms used herein should be interpreted as having a meaning that is consistent with the context of this specification and should not be interpreted in an idealized or overly formal sense.

Some block diagrams and/or flowcharts are shown in the accompanying drawings. It should be understood that some blocks in the block diagrams and/or flowcharts or combinations of the blocks can be implemented by computer program instructions. These computer program instructions may be provided to a processor of a general-purpose computer, a special-purpose computer, or other programmable data processing apparatus to produce a machine, such that the instructions, when executed by the processor, create means for implementing the functions/operations specified in these block diagrams and/or flowcharts. The techniques of the present disclosure may be implemented in hardware and/or software (including firmware, microcode, and the like). In addition, the techniques of the present disclosure may take the form of a computer program product on a computer-readable storage medium having instructions stored thereon for use by or in connection with an instruction execution system.

The topology optimization technology for the surface plasmon near-field photolithography mask based on the adjoint algorithm is an important photolithography resolution enhancement technology, which modulates the intensity distribution of the light field incident on the photoresist by optimizing the mask topology pattern, thereby improving the resolution and image fidelity of the photolithography system. The mask is characterized by a pixelated pattern, has a high optimization freedom degree, and meanwhile can evaluate the gradient updating information of the topological shape of the mask along the photolithography imaging quality optimization direction only by two times of simulation calculation based on the reciprocity of Green's function, so that the calculation throughput is greatly reduced, and the optimization speed is improved.

In the present disclosure, for convenience of explanation, only an expected imaging pattern, an initial mask pattern and a final mask pattern are referred to as patterns, and the results of the calculation process and the imaging process in the topology optimization are referred to as data, and it should be understood that the data in the process can output corresponding patterns correspondingly.

FIG. 1 schematically shows a schematic diagram of an application scenario of a mask topology optimization method that can be applied to surface plasmon near-field photolithography according to an embodiment of the present disclosure. It should be noted that FIG. 1 is only an example of an application scenario in which the embodiments of the present disclosure may be applied to help those skilled in the art understand the technical content of the present disclosure, and does not mean that the embodiments of the present disclosure may not be applied to other devices, systems, environments or scenarios.

As shown in FIG. 1, the surface plasmon near-field photolithography structure according to an embodiment of the present disclosure may be as shown in 101, and includes a structure of a mask ($SiO_2$+Cr), an air spacer layer (Air), a metal layer (Ag), a photoresist (Pr), a metal reflective layer (Ag), and a substrate ($SiO_2$). The interface diagrams of the surface plasmon near-field photolithography structure are shown as 102 and 103, the photolithography structure may further include a mask ($SiO_2$+Cr), an air spacer layer (Air), a photoresist (Pr), a metal reflective layer (Ag), and a substrate ($SiO_2$) (shown as 102), or may include a mask ($SiO_2$+Cr), an air spacer layer (Air), a metal layer (Ag), a photoresist (Pr), and a substrate ($SiO_2$) (shown as 103), as long as it is capable of realizing the surface plasmon near-field photolithography practically. In near-field surface plasmon photolithography, when a pattern on a mask is transferred to a semiconductor chip, poor contrast, poor fidelity, and non-uniformity are exhibited.

Based on this, the present disclosure provides a mask topology optimization method for surface plasmon near-field photolithography based on an adjoint algorithm, which can provide a mask pattern with a better effect according to actual requirements, and compensate for sub-wavelength electromagnetic influences such as optical proximity effect, stray light effect and mask shadow effect in a surface plasmon near-field photolithography system.

Figure 2:
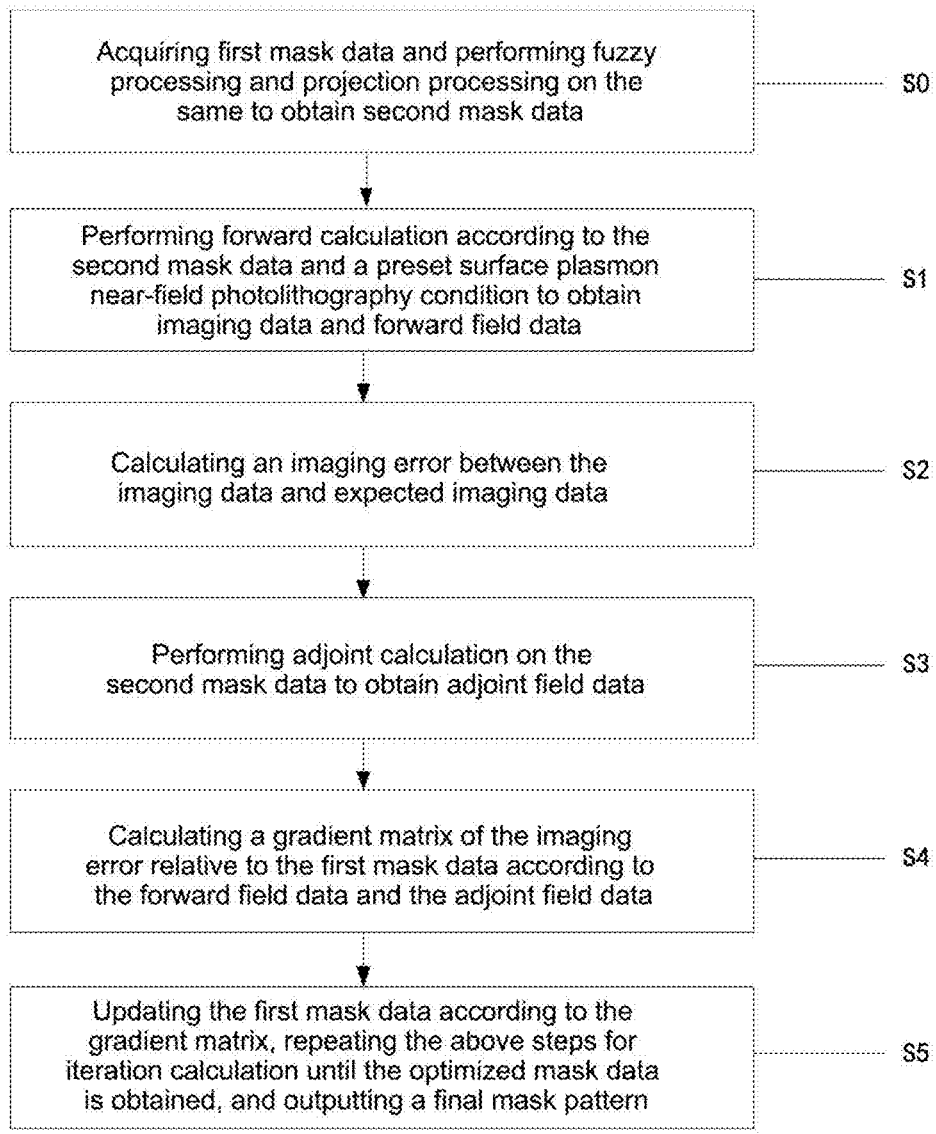
FIG. 2 schematically shows a flowchart a mask topology optimization method for surface plasmon near-field photolithography according to an embodiment of the present disclosure.

FIG. 2 schematically shows a flowchart of a mask topology optimization method for surface plasmon near-field photolithography according to an embodiment of the present disclosure.

As shown in FIG. 2, the mask topology optimization method for surface plasmon near-field photolithography includes:

Operation S0: acquiring first mask data and performing fuzzy processing and projection processing on the same to obtain second mask data.

An initial mask pattern is acquired based on an expected imaging pattern, and pixelation processing is performed on the initial mask pattern to obtain initial mask data and expected imaging data. Then the initial mask data or the updated mask data is taken as the first mask data for performing fuzzy processing and projection processing, so that second mask data can be obtained.

Operation S1: performing forward calculation according to the second mask data and a preset surface plasmon near-field photolithography condition to obtain imaging data and forward field data.

In this step, the surface plasmon near-field imaging performance of the mask is evaluated based on the set surface plasmon near-field photolithography structure. In this step, the imaging performance of the mask pattern in the photoresist under an exposure light source excitation source is calculated, and meanwhile, the forward field data is obtained and used for gradient updating of a follow-up adjoint algorithm, and this process is forward calculation or forward simulation in the present disclosure. It should be noted that, after passing through the mask, the light is imaged in the photoresist to form a light intensity distribution, which is the imaging data; and the forward field data herein refers to vector electric field data in the mask.

Operation S2: calculating an imaging error between the imaging data and expected imaging data.

This operation aims to calculate the error between the imaging pattern of the currently imaged mask in the corresponding photoresist and each pixel of a target pattern, which is realized through data calculation. The error set in the present disclosure aims at a pattern area error, and the value thereof needs to be selected according to the optimized mask complexity, the size of the pixelated grid, the total mask size and other specific problems as well as the expected tolerable pattern distortion degree. For a general integrated circuit mask, the optimized imaging area error is controlled within 1% to 3%.

Operation S3: performing adjoint calculation on the second mask data to obtain adjoint field data.

The second mask data is subjected to the adjoint calculation based on an adjoint algorithm proposed by the present disclosure. In this step, based on the forward calculation, a calculation of changing an imaging monitor in the photoresist to a specific adjoint source is called an adjoint calculation, and an optimization algorithm of obtaining a gradient matrix and updating a mask using the results of the forward calculation and the adjoint calculation is called an adjoint algorithm. It should be noted that the adjoint field is vector electric field data in the mask simulated and calculated based on a given adjoint excitation source.

Operation S4: calculating a gradient matrix of the imaging error relative to the first mask data according to the forward field data and the adjoint field data.

According to the result of the forward calculation in the step S1 and the result of the adjoint calculation in the step S3, the positive/negative and magnitude of the contribution of each pixel to the imaging quality is calculated, that is, the gradient matrix is obtained.

Operation S5: updating the first mask data according to the gradient matrix, repeating the above steps for iteration calculation until the optimized mask data is obtained, and outputting a final mask pattern.

The pixelated mask data is updated according to the gradient matrix obtained in the step S4, and the steps S0 to S5 are cyclically performed until the imaging performance in the step S2 satisfies the design specification.

Based on the forward simulation, the method according to the present disclosure is additionally provided with adjoint simulation, gradient calculation and mask processing, and fast iterative convergence is performed based on prior physical information, so that a mask pattern that is more suitable for surface plasmon photolithography and has a better effect is obtained while the optimization speed is improved.

Based on the above embodiment, the calculating an imaging error between the imaging data and expected imaging data includes: determining whether the imaging error is less than a threshold or whether the current accumulated iteration number is greater than a set value: if yes, outputting the current mask data as optimized mask data; otherwise, continuing to perform iteration calculation.

The current mask data used in the description of the present disclosure represents mask data processed in a corresponding step in a current iteration cycle, and may be the first mask data or the second mask data. Those skilled in the art can understand the meaning of the current mask data based on different processing steps. For example, in the above steps, the output current mask data is the second mask data satisfying the determination basis in the current iteration cycle, so as to facilitate the actual mask processing.

It is determined that whether the imaging performance of the mask pattern is within a preset threshold or not or whether the number of iterations exceeds the maximum number of iterations or not. The imaging performance is expressed by an imaging error function in the present disclosure, and when it is smaller than a threshold or the number of iterations is greater than the maximum number of iterations, the current mask data is output as optimized mask data, otherwise, the step S0 is performed for iteration calculation. For a general integrated circuit mask, it is often necessary to control the optimized imaging area error within 1% to 3%. For the number of optimization iterations, it is often required by the present disclosure 100 to 300 generations to reach the converged optimal value.

Figure 3:
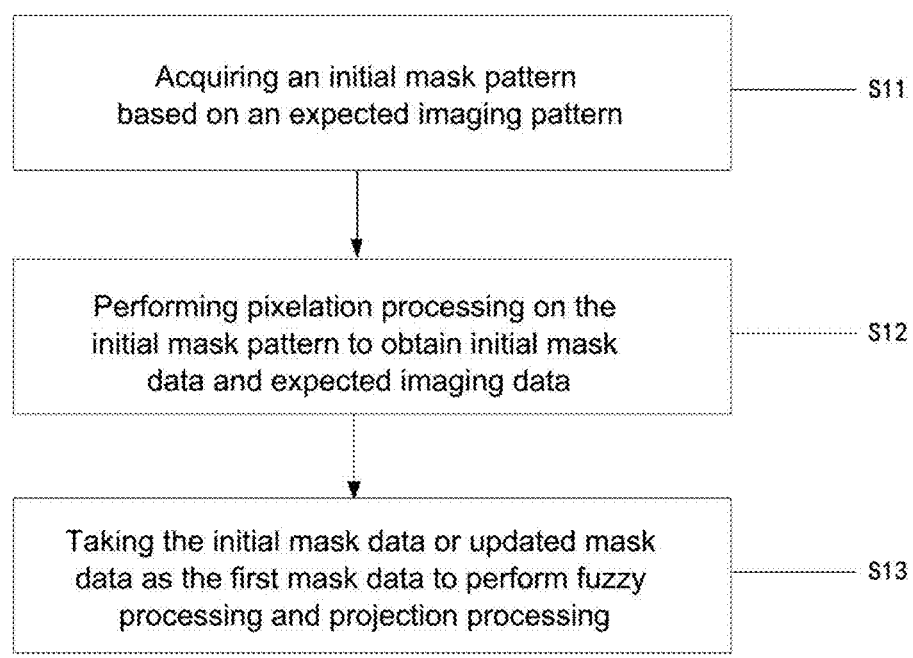
FIG. 3 schematically shows a flowchart of acquiring first mask data in a mask topology optimization method for surface plasmon near-field photolithography according to an embodiment of the present disclosure.

FIG. 3 schematically shows a flowchart of acquiring first mask data in a mask topology optimization method for surface plasmon near-field photolithography according to an embodiment of the present disclosure.

As shown in FIG. 3, the method of acquiring the first mask includes:

Operation S11: acquiring an initial mask pattern based on an expected imaging pattern. Herein, the expected imaging pattern is a target pattern.

Operation S12: performing pixelation processing on the initial mask pattern to obtain initial mask data and expected imaging data. Herein, the initial mask data is taken as the first mask data for a first generation iteration, and the expected imaging data corresponds to the initial mask data.

After the target pattern, which is the expected imaging pattern, is determined, an initial mask pattern is determined based on the target pattern, and the initial mask pattern is subjected to the pixelation processing to obtain the initial mask data. In this step, the data defining the pattern is a binarized and pixelated matrix.

Specifically, the expected imaging data is $P_d(x, y)$, the initial mask data is taken as the first mask data of the first generation iteration $\rho^1(r)$, and for the convenience of program identification processing, the initial mask pattern is rasterized and divided into equally spaced m×n pixelated grids, and in this case, the center coordinate values of each pixel block are discrete values.

Operation S13: taking the initial mask data or updated mask data as the first mask data for performing fuzzy processing and projection processing to obtain second mask data.

In this step, the initial mask data or the updated mask data is subjected to fuzzy processing, and the structure that cannot be machined and is smaller than the minimum design rule is removed; and then binarization projection processing is performed on the mask data after the fuzzy processing, so as to obtain the mask data after projection that meets the actual physical model, and then subsequent calculation is performed. This step can meet actual mask processing requirements.

Based on the above embodiment, the initial mask data $\rho(r)$ or the updated mask data is subjected to linear fuzzy to obtain $\tilde{\rho}(r)$ and is subjected to binarization projection processing to obtain $\bar{\rho}(r)$.

The linear fuzzy function is:

$$\tilde{\rho}(r) = \sum_{r_j} \frac{1}{\alpha} \rho(r) B(r, r_j)$$

where $\alpha=\Sigma_{r_j} B(r, r_j)$, $B(r, r_j)=\max\{0, R_{filt}-\|r-r_j\|\}$, $R_{filt}$ is a fuzzy radius, $\rho(r)$ is the initial mask data or the updated mask data, i.e., the first mask data, $\tilde{\rho}(r)$ is mask data after the fuzzy processing, r is coordinates of any point in the current mask data, and $\Sigma_{r_j}$ represents the summation at the r coordinate by traversing all coordinate points $r_j$ in the current mask data.

Through linear fuzzy processing, the purpose of denoising can be achieved, and the image is smoother, meanwhile, the mask distribution can be smoother, and the actual processing requirements are met.

Based on the above embodiment, the binarization projection function is:

$$\bar{\rho}(r) = \begin{cases} \eta e^{\frac{\beta(\eta-\tilde{\rho}(r))}{\eta}} - (\eta - \tilde{\rho}(r))e^{-\beta}, 0 \leq \tilde{\rho}(r) \leq \eta \\ 1 - (1-\eta)e^{\frac{\beta(\tilde{\rho}(r)-\eta)}{\eta}} - (\eta - \tilde{\rho}(r))e^{-\beta}, \eta < \tilde{\rho}(r) \leq 1 \end{cases}$$

where $\beta$ is a binarized parameter, $\eta$ is a binarized threshold, $\tilde{\rho}(r)$ is the mask data after the fuzzy processing, and $\bar{\rho}(r)$ is mask data after the projection processing, i.e., the second mask data.

The mask matrix value of the second mask data after the binarization processing is close to 0 or 1, and the physical meaning that the actual mask only has two states of transparency or opacity is met.

Based on the above embodiment, the SPL imaging performance of the mask pattern is evaluated based on the given surface plasmon photolithography structure, and the imaging data of the current mask data in the photoresist is obtained.

The present disclosure is suitable for optimizing any mask pattern, and for complex mask patterns with multiple directions, TM/TE polarized plane waves subjected to two independent exposures are used as an exposure light source excitation source for forward calculation. Therefore, for independently exposed the TM/TE dual-polarization plane wave light source, the electric field in the photoresist can be strictly calculated by a finite-difference time-domain algorithm, and the influence of complex coupling among sub-wavelength structures and stray light on a space image can be considered in full-wave calculation. The imaging result in the photoresist corresponding to the current mask data is the sum of the three component intensities of the electric field. The development process can be characterized by a binarization function $\Gamma\{\cdot\}$, so that the actual photolithography imaging data is represented as $P_a=\Gamma\{|E_{TM}(x, y)|^2+|E_{TE}(x, y)|^2-I_{th}\}$, where $I_{th}$ is a photoresist threshold. The vector field in the mask is monitored simultaneously, which is called the forward field $E_{for}(r)$. For example, 702 is a pattern corresponding to the light intensity distribution data in the photoresist after the light passes through the initial mask pattern and through the SPL system in a first embodiment, and 703 is an exposure pattern corresponding to the binarized imaging data.

Based on the above embodiments, the present disclosure defines the imaging error function F as: the sum of squares of the differences between pixels of the imaging pattern in the photoresist corresponding to the current mask pattern and the target pattern, which is specifically calculated by the data, that is $F=\Sigma|P_a(x, y)-P_d(x, y)|^2/(m \times n) \times 100\%$, where $P_a(x, y)$ is imaging data corresponding to the current mask data under the preset surface plasmon near-field photolithography condition, $P_d(x, y)$ is the expected imaging data, (x, y) is coordinates in the imaging data, and m and n are the numbers of sampling points in x and y directions corresponding to the imaging data.

If the currently calculated imaging error function value meets a set threshold or the number of iterations is greater than the maximum number of iterations, the current mask data is output as optimized mask data, otherwise, the iteration calculation is continued.

Figure 4:
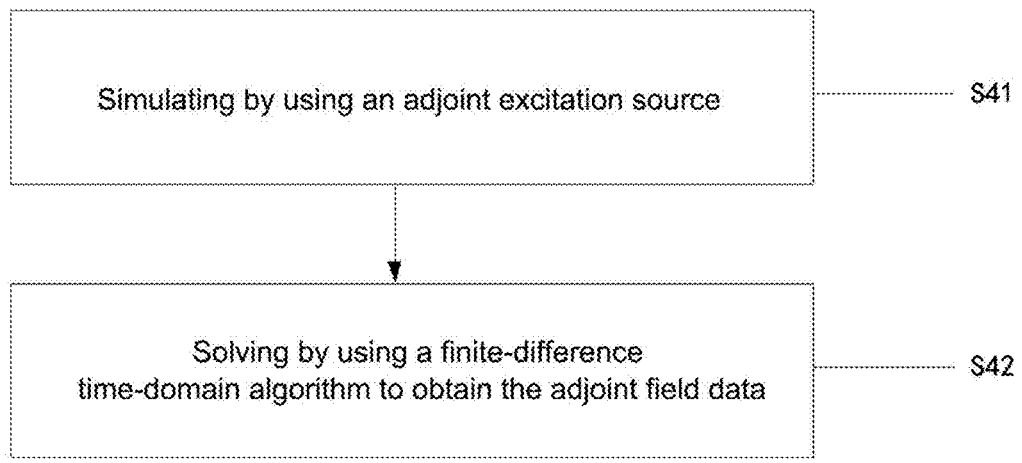
FIG. 4 schematically shows a flowchart of performing adjoint calculation in a mask topology optimization method for surface plasmon near-field photolithography according to an embodiment of the present disclosure.

FIG. 4 schematically shows a flowchart of performing adjoint calculation in a mask topology optimization method for surface plasmon near-field photolithography according to an embodiment of the present disclosure.

As shown in FIG. 4, the method of performing adjoint calculation on the second mask data includes:

Operations S41: simulating by using an adjoint excitation source.

According to the reciprocity of the Green's function, it is found that when the imaging monitor is changed to the following excitation source for simulation under the condition that the current mask data $\bar{\rho}(r)$ is kept unchanged, the adjoint field $E_{adj}(r)$ on the mask carries gradient information required for optimization, and in this case, since the positions of the imaging monitor and the source are exchanged at this time, it is called adjoint calculation.

The adjoint excitation sources given are as follows:

$$2A(P'_a - P_d)P'^2_a \exp[-A(P_a - I_{th})]E^*_{TM}(x, y), \text{ for } TM \text{ adjoint}$$

$$2A(P'_a - P_d)P'^2_a \exp[-A(P_a - I_{th})]E^*_{TE}(x, y), \text{ for } TE \text{ adjoint}$$

Operation S42: solving by using a finite-difference time-domain algorithm to obtain the adjoint field data.

Herein, since the function $P_a(x, y)$ does not satisfy the Cauchy-Riemann equation and is not beneficial to gradient optimization, the $P'_a(x, y)$ approximated by the Sig(·)-shaped function of the actual imaging pattern is used to represent the current imaging pattern, that is, $$P'_a(x, y) = Sig(P_a, I_{th}) = \frac{1}{1 + \exp[-A(P_a - I_{th})]}.$$

The adjoint calculation can be solved strictly using a finite-difference time-domain algorithm, and the vector field components in the mask can then be monitored to derive the adjoint field $E_{adj}(r)$.

Based on the above embodiment, a gradient matrix $G(r) = \partial F/\partial \rho(r) = n(r) \text{Re}\{E_{for}(r) \cdot E_{adj}(r)\}$ of the imaging error function F relative to the first mask data $\rho(r)$ is calculated based on the forward field $E_{for}(r)$ obtained in the step S1 and the vector electric field data of the adjoint field $E_{adj}(r)$ obtained in the step S3, where n(r) is the refractive index distribution of the current mask data, and the obtained gradient matrix represents the positive/negative and magnitude of the contribution of each pixel of the current mask data to the imaging quality.

Based on the above embodiment, the first mask data is updated once according to the gradient matrix calculated in the above steps, and the updated mask matrix $\rho^{k+1}(r)$ is obtained by combining the current mask matrix $\rho^k(r)$ and the gradient matrix, that is, $\rho^{k+1}(r) = \rho^k(r) + s \cdot G(r)$, where k is the number of current iterations, s is a preset optimization step size, and an empirical value of s is generally 0.01 to 0.1 and can be reduced along with the increase of the number of iterations, so as to improve the convergence stability of the algorithm.

After the update, all pixel values of the updated mask data are limited to the range of [0, 1], so as to ensure that the mask data conforms to the actual physical meaning, where pixel values greater than 1 are set to 1, pixel values less than 0 are set to 0, and pixel values in the range of [0, 1] are kept unchanged, followed by returning to the step S1.

Based on the above embodiment, outputting the current mask data as the optimized mask data and outputting the final mask pattern includes: outputting the current mask data as optimized mask data, extracting an edge of the optimized mask data by using an edge smoothing method and removing pixelated jaggy, and then outputting the final mask pattern. The output optimized mask data is the current second mask data to meet the actual processing requirement.

The present disclosure takes the pixelation density parameter of the mask as an optimization parameter and finally determines the shape of the optimized mask pattern by topology optimization. The mask processing part of the present disclosure is to segment the mask pattern into a pixelated grid and obtain pixelated mask data, each pixel can be represented by a value between 0 and 1, where 0 represents a transparent mask and 1 represents an opaque mask. The adjoint calculation is introduced based on the forward calculation to obtain an optimized gradient and to adjust and compensate for the topological morphology of the mask, so as to improve the imaging fidelity and the yield of the product. Through two times of calculation of forward and adjoint simulation, the optimized gradient direction of each generation is obtained, so that the optimal mask structure parameters are converged quickly, meanwhile the compensation of the sub-wavelength electromagnetic proximity effect is realized, and the higher imaging fidelity is obtained. Further, the optimized mask obtained in the previous step can be used in the method for surface plasmon near-field photolithography.

Figure 5:
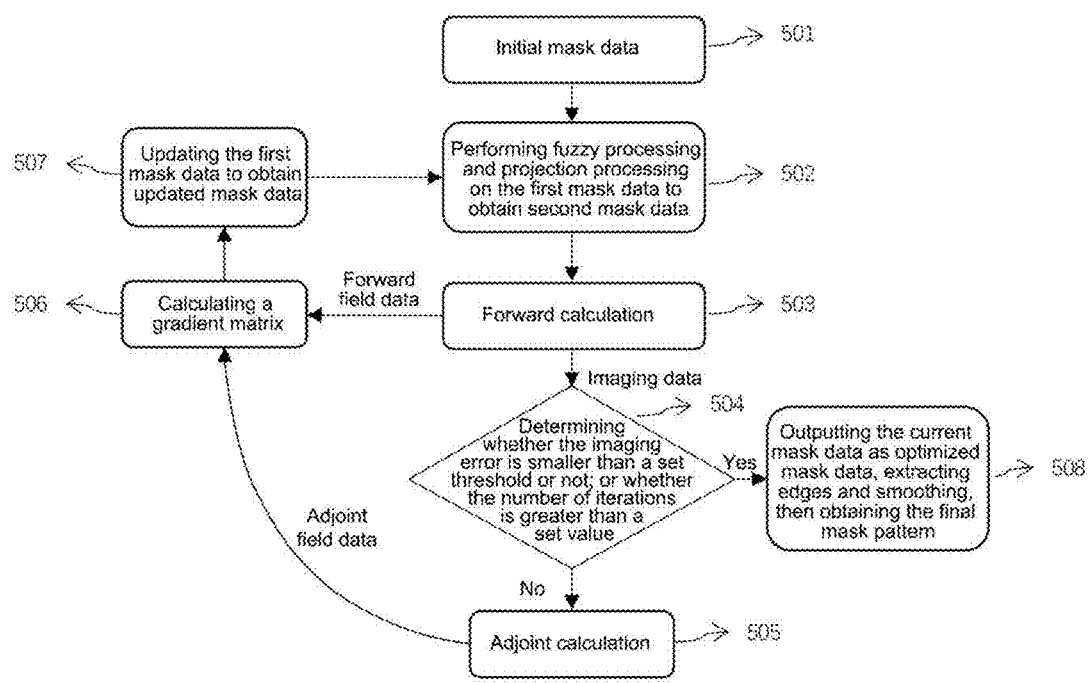
FIG. 5 schematically shows a flowchart of a mask topology optimization method for surface plasmon near-field photolithography according to an exemplary embodiment of the present disclosure.

The steps of this method are further described below with a specific embodiment, and the complete flowchart of the method is shown in FIG. 5.

Specifically, the method of the present disclosure includes the following steps:

Step 501: determining an expected imaging pattern, namely a target pattern, determining an initial mask pattern based on the target pattern, and performing pixelation processing on the initial mask pattern to obtain and input initial mask data. The mask data defined in this step is a binarized and pixelated matrix.

The initial mask data is defined as the first mask data of the first generation iteration, and the updated mask data obtained after the iteration is determined by the first mask data of the previous generation and the gradient matrix together.

Step 502: performing fuzzy processing and projection processing on the first mask data, namely the initial mask data or the updated mask data, to obtain the second mask data. In this step, the initial mask data or the updated mask data is subjected to fuzzy processing, and the structure that cannot be machined and is smaller than the minimum design rule is removed; and then binarization projection processing is performed on the mask data after the fuzzy processing to obtain the mask data after the projection processing, so that the mask data can meet the actual physical model.

Step 503: evaluating the surface plasmon near-field imaging performance of the current mask data based on the set surface plasmon near-field photolithography structure. In this step, the imaging performance of the current mask data in the photoresist under the excitation of the exposure light source is calculated, and meanwhile, the forward field data is obtained and used for the gradient update of the subsequent adjoint algorithm, where the vector electric field distribution value in the mask is the forward field, and the process is forward calculation or forward simulation in the present disclosure, which is equivalent to the S1 described above.

Step 504: determining whether the imaging performance of the current mask data is within a preset threshold or whether the number of iterations exceeds the maximum number of iterations. This imaging performance is expressed in the present disclosure as an imaging error function, which is defined as the sum of squares of the differences between pixels of the imaging pattern of the current mask data in the corresponding photoresist and the expected imaging data. When it is smaller than a threshold or the number of iterations is greater than the maximum number of iterations, the step 508 is performed, otherwise, the step 505 is performed, which is equivalent to the S2 described above.

Step 505: performing adjoint calculation on the second mask data based on an adjoint algorithm proposed by the present disclosure. In this step, based on the forward calculation, a calculation of changing an imaging monitor in the photoresist to a specific adjoint source is called adjoint calculation, the adjoint calculation is used to simulate and calculate the virtual adjoint field data based on the given adjoint excitation source, and the optimization algorithm that uses the results of forward calculation and adjoint calculation to obtain the gradient updated mask is called the adjoint algorithm, which is equivalent to the S3 described above.

In steps 503 and 505, the forward calculation and the adjoint calculation can use a finite-difference time-domain method for fast and accurate calculation.

Step 506: calculating the positive/negative and magnitude of the contribution of each pixel to the imaging quality according to the result of the forward calculation in step 503 and the result of the adjoint calculation in step 505, that is, obtaining a gradient matrix, which is equivalent to the S4 described above.

Step 507: updating the pixelated first mask data according to the gradient matrix obtained in the step 506 to obtain an updated mask matrix, and cyclically performing steps 502 to 507 until the imaging performance in step 504 meets the design specification, which is equivalent to the S5 described above.

Step 508: after the optimization is finished, outputting the current mask data as optimized mask data, extracting an edge by using an edge smoothing method, removing useless and unmanufacturable pixelated edge jaggy, and obtaining the final mask pattern that is topology optimized.

According to the steps 501 to 508, the following three embodiments are provided.

Embodiment 1

In FIG. 1, 101 is a structure including a mask, an air spacer layer, a metal layer, a photoresist, a metal reflective layer, and a substrate. In this embodiment, the thickness of the mask is set to be 50 nm, the air spacer is 20 nm, an upper metal layer of the photoresist is 20 nm, a lower metal layer of the photoresist is 70 nm, and the thickness of the photoresist is 40 nm.

Figure 6:
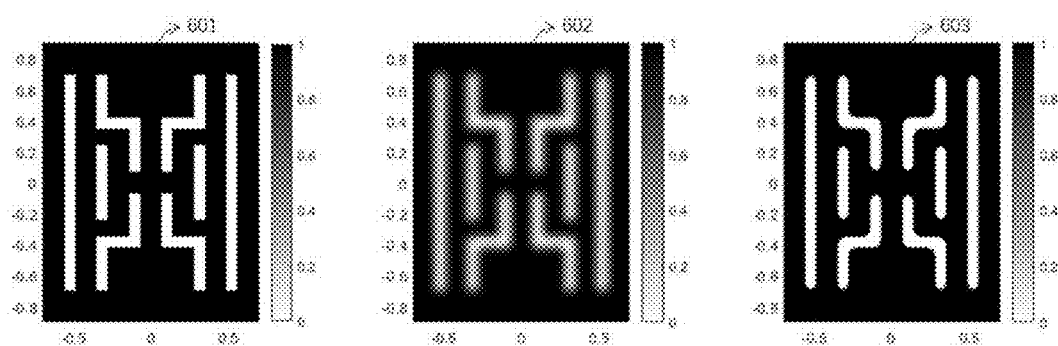
FIG. 6 schematically shows a schematic diagram of patterns corresponding to initial mask data, mask data after fuzzy processing and mask data after projection processing according to Embodiment 1 of the present disclosure.

FIG. 6 sequentially shows schematic diagrams of patterns corresponding to initial mask data $\rho^1(r)$ in 601, mask data that is fuzzy processed $\tilde{\rho}^1(r)$ in 602 and mask data that is binarization projection processed $\bar{\rho}^1(r)$ in 603.

Figure 7:
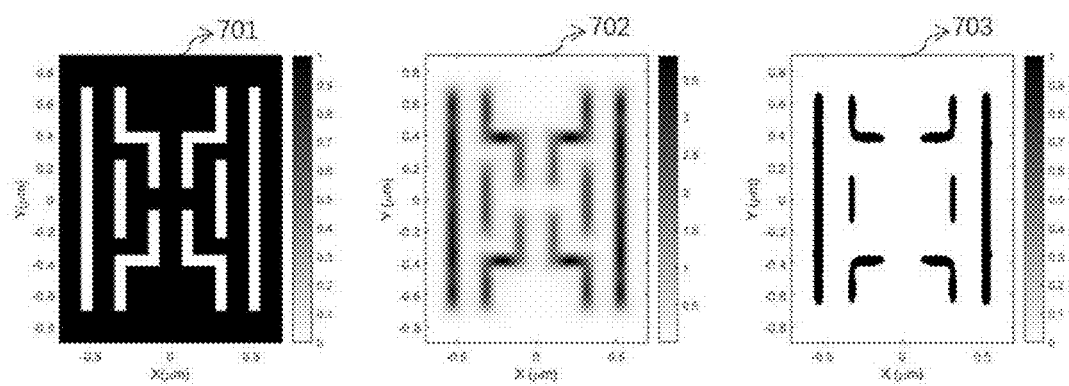
FIG. 7 schematically shows a schematic diagram of patterns corresponding to initial mask data and imaging data in a corresponding photoresist according to Embodiment 1 of the present disclosure.

Next, the SPL imaging performance of the current mask data is evaluated. As shown in FIG. 7, 701 is a pattern corresponding to the initial mask data, which corresponds to the expected imaging pattern, i.e., the target pattern, where the white area represents the transparent part, and the black represents the opaque mask part, and the critical feature size is 70 nm; 702 represents a pattern corresponding to light intensity distribution data in the photoresist by the SPL system with 701 as a mask pattern, and 703 represents a pattern corresponding to exposure data after binarization, where the exposure binarization threshold of the photoresist is set to 2 ($I_{th}=2$).

The imaging error is calculated to be 9.1911%, the threshold of the imaging error is set to be 1.5%, and the number of optimization iterations is set to be 250; it can be seen that the set threshold is not met.

Figure 8:
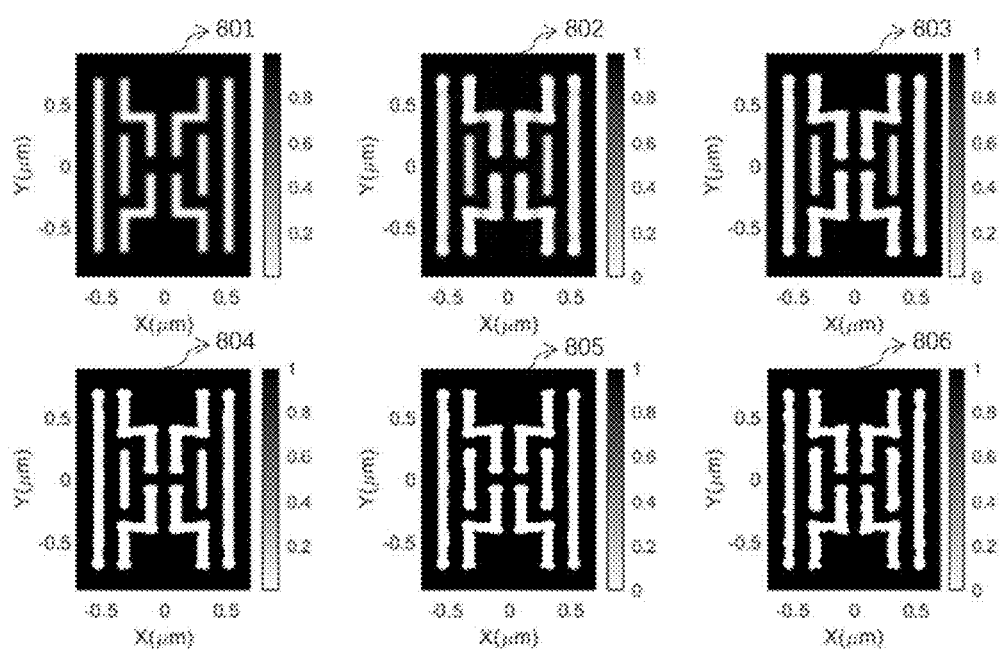
FIG. 8 schematically shows an iterative evolution diagram of a pattern corresponding to second mask data in a mask topology optimization process according to Embodiment 1 of the present disclosure.

According to the steps 502 to 508, a gradient matrix is obtained based on the adjoint field data and the forward field data, and the pixel value of the first mask data is updated. The iteration is repeated, the iteration evolution of the pattern corresponding to the second mask data is shown as 801 to 806 in FIG. 8, and finally the optimized mask data is obtained and output to obtain a final mask pattern.

Figure 9:
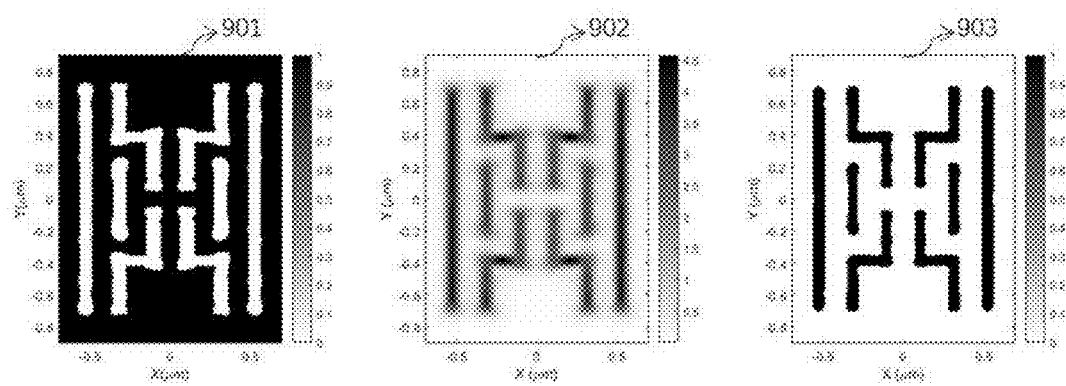
FIG. 9 schematically shows a schematic diagram of patterns corresponding to optimized mask data and imaging data in a corresponding photoresist according to Embodiment 1 of the present disclosure.

FIG. 9 is a schematic diagram of patterns corresponding to the mask data optimized by using the method of the present disclosure and imaging data in the corresponding photoresist. 901 is a pattern corresponding to mask data obtained by topology optimization according to the method of the present disclosure, 902 is a pattern corresponding to light intensity distribution data in photoresist by an SPL system with 901 as the mask pattern, 903 is a pattern corresponding to exposure data after light intensity binarization of 902, where the exposure binarization threshold of the photoresist is 2, and the imaging error is 1.6944%.

Compared with FIG. 7 and FIG. 9, it can be known that the method of the present disclosure can effectively compensate for the optical proximity effect, the stray light effect, the mask shadow effect, and other strong near-field coupling effects in the SPL lithography system, and provide a mask pattern with a better effect for the actual requirements of surface plasmon lithography.

Embodiment 2

Figure 10:
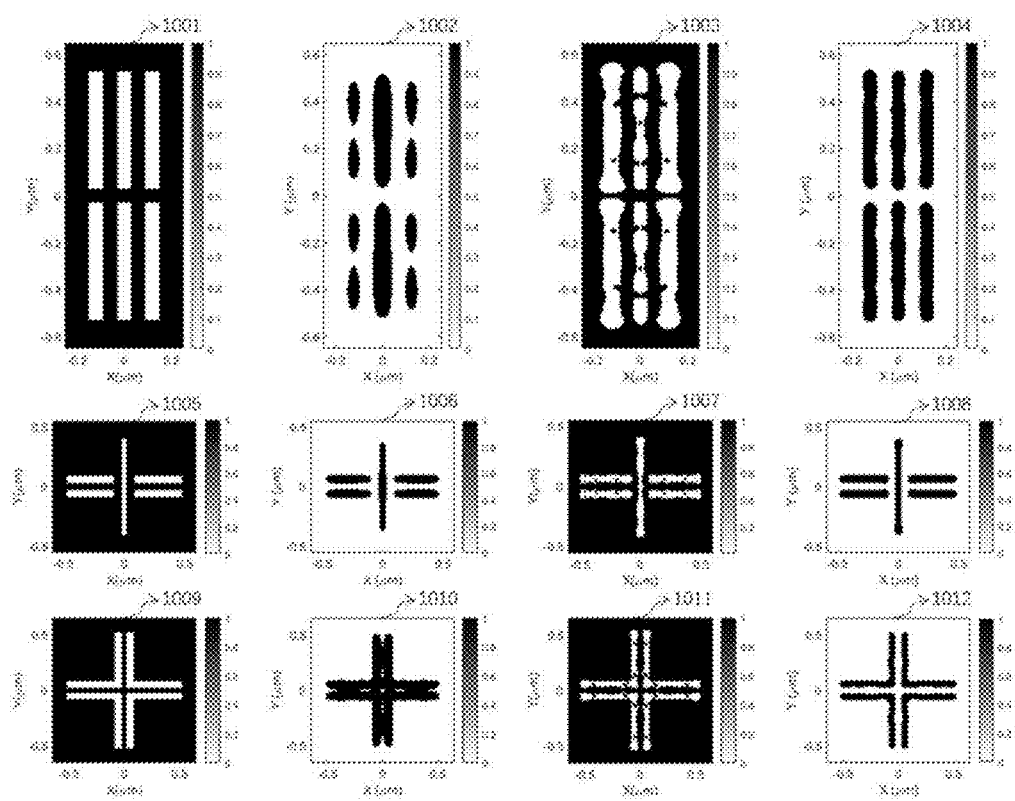
FIG. 10 schematically shows a schematic diagram of patterns corresponding to mask data and imaging data in a corresponding photoresist before and after optimization based on the method using structure 101 according to Embodiment 2 of the present disclosure.

FIG. 10 is a schematic diagram showing patterns corresponding to mask data before and after optimization by using the mask topology optimization method based on the adjoint algorithm of the present disclosure and imaging data in a corresponding photoresist in the SPL lithography structure shown in 101 in FIG. 1, in which the cases before and after optimization of three mask patterns are listed. 1001, 1005 and 1009 are initial mask patterns; 1002, 1006, 1010 are corresponding photoresist imaging patterns after the binarization exposure treatment; 1003, 1007 and 1011 are the final mask patterns output after the iteration is finished; and 1004, 1008 and 1012 are the final imaging patterns.

Herein, the thickness of the mask is set to be 40 nm, the air spacer layer is 30 nm, an upper metal layer of the photoresist is 20 nm, a lower metal layer of the photoresist is 50 nm, the thickness of the photoresist is 30 nm, and the feature size of the mask is 60 nm. The imaging error values of the three mask patterns after optimization of the present disclosure are respectively reduced from 12.3%, 3% and 6.8% to 2.1%, 2.1% and 2.7%. The imaging error threshold of this embodiment is set to 2%, and the number of iterations is 200 generations.

Embodiment 3

Figure 11:
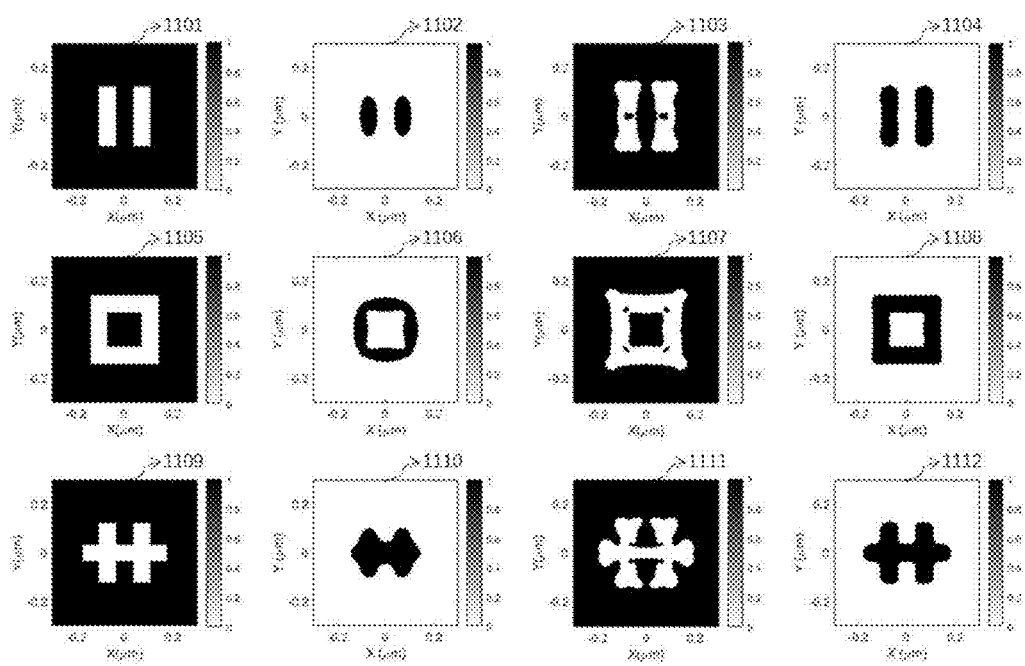
FIG. 11 schematically shows a schematic diagram of patterns corresponding to mask data and imaging data in a corresponding photoresist before and after optimization based on the method using structure 102 according to Embodiment 3 of the present disclosure.

FIG. 11 is a schematic diagram showing patterns corresponding to mask data before and after optimization by using the mask topology optimization method based on the adjoint algorithm of the present disclosure and imaging data in a corresponding photoresist, in the SPL lithography structure shown in 102 in FIG. 1, in which the cases before and after optimization of three mask patterns are listed. 1101, 1105 and 1109 are initial mask patterns; 1102, 1106, 1110 are corresponding photoresist imaging patterns after the binarization exposure treatment; 1103, 1107 and 1111 are final mask patterns output after the iteration is finished; and 1104, 1108 and 1112 are the final imaging patterns.

Herein, the thickness of the mask is set to be 40 nm, the air spacer layer is 20 nm, the photoresist is 30 nm, the thickness of the lower metal layer is 70 nm, and the feature size of the mask is 70 nm. The imaging error values of the three mask patterns after optimization of the present disclosure are respectively reduced from 4.2%, 6.1% and 4.7% to 0.7%, 0.6% and 1.4%. The imaging error threshold of this embodiment is set to 0.5%, and the number of iterations is 120 generations.

Figure 12:
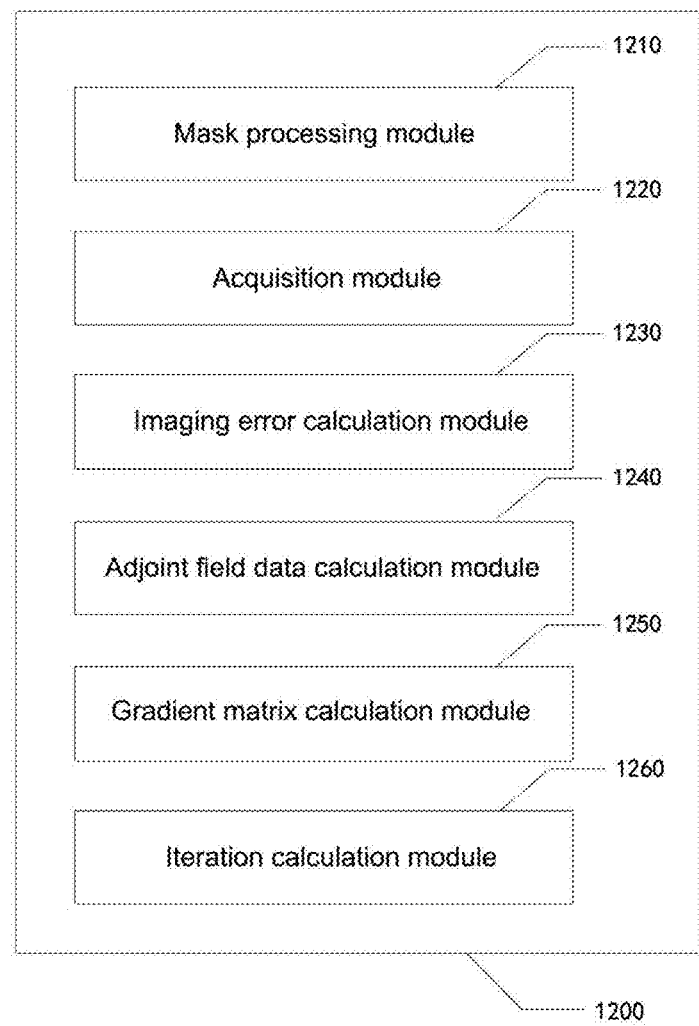
FIG. 12 schematically shows a block diagram of a mask topology optimization system for surface plasmon near-field photolithography according to an embodiment of the present disclosure.

FIG. 12 schematically shows a block diagram of a mask topology optimization system for surface plasmon near-field photolithography according to an embodiment of the present disclosure.

As shown in FIG. 12, a mask topology optimization system 1200 for surface plasmon near-field photolithography includes: a mask processing module 1210, an acquisition module 1220, an imaging error calculation module 1230, an adjoint field data calculation module 1240, a gradient matrix calculation module 1250, and an iteration calculation module 1260.

The mask processing module 1210 is configured to acquire first mask data and perform fuzzy processing and projection processing on the same to obtain second mask data. According to an embodiment of the present disclosure, the mask processing module 1210 may, for example, be configured to perform the step S1 described above with reference to FIG. 2. Details are not described herein again.

The acquisition module 1220 is configured to perform forward calculation according to the second mask data and a preset surface plasmon near-field photolithography condition to obtain imaging data and forward field data. According to an embodiment of the present disclosure, the acquisition module 1220 may, for example, be configured to perform the step S2 described above with reference to FIG. 2. Details are not described herein again.

The imaging error calculation module 1230 is configured to calculate an imaging error between the imaging data and expected imaging data. According to an embodiment of the present disclosure, the imaging error calculation module 1230 may, for example, be configured to perform the step S3 described above with reference to FIG. 2. Details are not described herein again.

The adjoint field data calculation module 1240 is configured to perform adjoint calculation on the mask data to obtain adjoint field data. According to an embodiment of the present disclosure, the adjoint field data calculation module 1240 may, for example, be configured to perform the step S4 described above with reference to FIG. 2. Details are not described herein again.

The gradient matrix calculation module 1250 is configured to calculate a gradient matrix of the imaging error relative to the first mask data according to the forward field data and the adjoint field data. According to an embodiment of the present disclosure, the gradient matrix calculation module 1250 may, for example, be configured to perform the step S5 described above with reference to FIG. 2. Details are not described herein again.

The iteration calculation module 1260 is configured to update the first mask data according to the gradient matrix, repeating the steps for iteration calculation until the optimized mask data is obtained, and output a final mask pattern. According to an embodiment of the present disclosure, the iteration calculation module 1260 may, for example, be configured to perform the step S6 described above with reference to FIG. 2. Details are not described herein again.

It should be noted that any number of modules, sub-modules, units and sub-units, or at least part of the functionality of any number thereof according to the embodiments of the present disclosure may be implemented in one module. Any one or more of the modules, sub-modules, units and sub-units according to the embodiments of the present disclosure may be implemented by being split into a plurality of modules. Any one or more of the modules, sub-modules, units and sub-units according to the embodiments of the present disclosure may be implemented at least partially as a hardware circuit, such as a field programmable gate array (FPGA), a programmable logic array (PLA), a system on a chip, a system on a substrate, a system on a package and an application specific integrated circuit (ASIC), or by any other reasonable means of hardware or firmware for integrating or packaging a circuit, or implemented by any one of or a suitable combination of any of software, hardware, and firmware. Alternatively, one or more of the modules, sub-modules, units and sub-units according to the embodiments of the present disclosure may be implemented at least partly as a computer program module which, when executed, may perform a corresponding function.

For example, any number of the mask processing module 1210, the acquisition module 1220, the imaging error calculation module 1230, the adjoint field data calculation module 1240, the gradient matrix calculation module 1250 and the iteration calculation module 1260 may be combined in one module to be implemented, or any one of the modules may be split into multiple modules. Alternatively, at least part of the functionality of one or more of these modules may be combined with at least part of the functionality of other modules and implemented in one module. According to an embodiment of the present disclosure, at least one of the mask processing module 1210, the acquisition module 1220, the imaging error calculation module 1230, the adjoint field data calculation module 1240, the gradient matrix calculation module 1250 and the iteration calculation module 1260 may be implemented at least partially as a hardware circuit, such as a field programmable gate array (FPGA), a programmable logic array (PLA), a system on a chip, a system on a substrate, a system on a package and an application specific integrated circuit (ASIC), or implemented by any other reasonable means of hardware or firmware for integrating or packaging a circuit, or implemented by any one of or a suitable combination of any of software, hardware, and firmware. Alternatively, at least one of the mask processing module 1210, the acquisition module 1220, the imaging error calculation module 1230, the adjoint field data calculation module 1240, the gradient matrix calculation module 1250 and the iteration calculation module 1260 may be implemented at least partly as a computer program module which, when executed, may perform a corresponding function.

Figure 13:
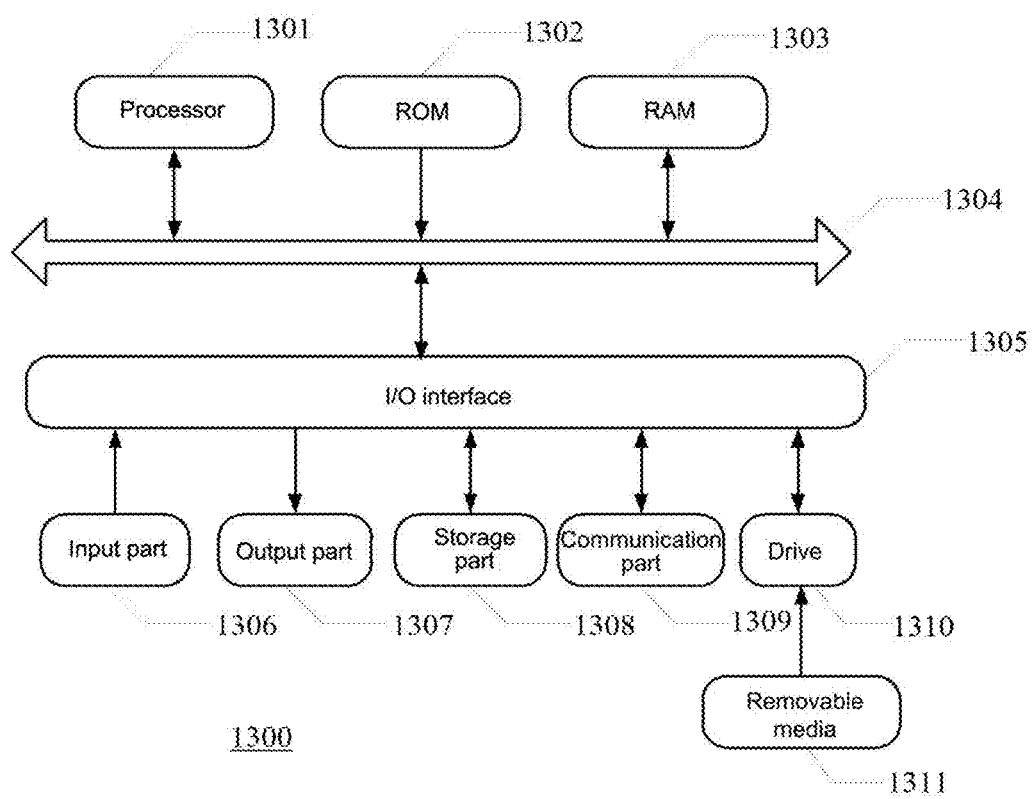
FIG. 13 schematically shows a block diagram of an electronic device adapted to implement the method described above according to an embodiment of the present disclosure.

FIG. 13 schematically shows a block diagram of an electronic device adapted to implement the method described above according to an embodiment of the present disclosure. The electronic device shown in FIG. 13 is only an example, and should not bring any limitation to the functions and the scope of use of the embodiments of the present disclosure.

As shown in FIG. 13, the electronic device 1300 described in this embodiment includes: a processor 1301, which can perform various appropriate actions and processes according to a program stored in a read-only memory (ROM) 1302 or a program loaded from a storage part 1308 into a random access memory (RAM) 1303. The processor 1301 may include, for example, a general purpose microprocessor (e.g., a CPU), an instruction set processor and/or related chip sets and/or a special purpose microprocessor (e.g., an application specific integrated circuit (ASIC)), and the like. The processor 1301 may further include on-board memory for caching purposes. The processor 1301 may include a single processing unit or multiple processing units for performing the different actions of the method flows according to embodiments of the present disclosure.

In the RAM 1303, various programs and data necessary for the operation of the system 1300 are stored. The processor 1301, the ROM 1302 and the RAM 1303 are connected to each other by a bus 1304. The processor 1301 performs various operations of the method flows according to embodiments of the present disclosure by executing programs in the ROM 1302 and/or the RAM 1303. It should be noted that the programs may also be stored in one or more memories other than the ROM 1302 and the RAM 1303. The processor 1301 may also perform various operations of method flows according to embodiments of the present disclosure by executing programs stored in the one or more memories.

According to embodiments of the present disclosure, the electronic device 1300 may further include input/output (I/O) interface 1305, which is also connected to the bus 1304. The system 1300 may further include one or more of the following components connected to the I/O interface 1305: an input part 1306 including a keyboard, a mouse, and the like; an output part 1307 including, for example, a cathode ray tube (CRT), a liquid crystal display (LCD), and the like, and a speaker; a storage part 1308 including a hard disk and the like; and a communication part 1309 including a network interface card such as a LAN card, a modem, and the like. The communication part 1309 performs communication processing via a network such as the Internet. The drive 1310 is also connected to the I/O interface 1305 as needed. The removable media 1311 such as a magnetic disc, an optical disc, a magnetic optical disc, a semiconductor memory and the like are installed on the drive 1310 as needed, so that a computer program read out therefrom is installed in the storage part 1308 as needed.

According to an embodiment of the present disclosure, the method flows according to embodiments of the present disclosure may be implemented as a computer software program. For example, embodiments of the present disclosure include a computer program product including a computer program embodied on a computer-readable storage medium, and the computer program contains program code for performing the method illustrated by the flowchart. In such embodiments, the computer program can be downloaded and installed from the network through the communication part 1309, and/or installed from the removable media 1311. When the computer program is executed by the processor 1301, the above functions defined in the system of the embodiment of the present disclosure are performed. According to embodiments of the present disclosure, the above described systems, devices, apparatuses, modules, units, and the like may be implemented by a computer program module.

An embodiment of the present disclosure further provides a computer-readable storage medium, which may be included in the device/apparatus/system described in the above embodiments; or may exist alone without being assembled into the device/apparatus/system. The computer-readable storage medium carries one or more programs which, when executed, implement the mask topology optimization method for surface plasmon near-field photolithography according to embodiments of the present disclosure.

According to embodiments of the present disclosure, the computer-readable storage medium may be a non-volatile computer-readable storage medium, which may include, for example but is not limited to: a portable computer disk, a hard disk, a random access memory (RAM), a read-only memory (ROM), an erasable programmable read-only memory (EPROM or flash memory), an optical fiber, a portable compact disk read-only memory (CD-ROM), an optical storage device, a magnetic storage device, or any suitable combination thereof. In the embodiments of the present disclosure, the computer-readable storage medium may be any tangible medium including or storing a program that may be used by an instruction execution system, apparatus, or device, or be used in combination with an instruction execution system, apparatus, or device. For example, according to the embodiments of the present disclosure, a computer-readable storage medium may include the ROM 1302 and/or the RAM 1303 described above, and/or one or more memories other than the ROM 1302 and the RAM 1303.

An embodiment of the present disclosure further includes a computer program product including a computer program, and the computer program contains program code for performing the method illustrated by the flowchart. When the computer program product runs in a computer system, the program code is configured to cause the computer system to implement the mask topology optimization method for surface plasmon near-field photolithography provided by the embodiment of the present disclosure.

The computer program, when executed by the processor 1301, performs the functions defined in the systems/apparatuses of the embodiments of the present disclosure. According to embodiments of the present disclosure, the above described systems, apparatuses, modules, units, and the like may be implemented by a computer program module.

In an embodiment, the computer program may be hosted on a tangible storage medium such as an optical storage device and a magnetic storage device. In another embodiment, the computer program may also be transmitted in the form of a signal, distributed over a network medium, downloaded and installed via the communication part 1309, and/or installed from the removable media 1311. The program code contained in the computer program can be transmitted using any suitable network medium, including but not limited to: a wireless medium, a wired medium and the like, or any suitable combination of the above.

In such embodiments, the computer program can be downloaded and installed from the network through the communication part 1309, and/or installed from the removable media 1311. When the computer program is executed by the processor 1301, the above functions defined in the system of the embodiment of the present disclosure are performed. According to the embodiments of the present disclosure, the above described systems, devices, apparatuses, modules, units, and the like may be implemented by a computer program module.

According to embodiments of the present disclosure, program code for executing the computer programs provided by the embodiments of the present disclosure may be written in any combination of one or more programming languages, and specifically, these computer programs may be implemented using high level procedural and/or object oriented programming languages, and/or assembly/machine languages. The programming languages include, but are not limited to, programming languages such as Java, C++, Python, "C" language or similar programming languages. The program code may be completely executed on a computing device of a user, partially executed on a user device, partially executed on a remote computing device, or completely executed on a remote computing device or a server. When the program code is executed on the remote computing device, the remote computing device may be connected to the computing device of the user by using any type of network, including a local area network (LAN) or a wide area network (WAN), or may be connected to an external computing device (for example, connected by using an Internet service provider through the Internet).

It should be noted that the functional modules in the embodiments of the present disclosure may be integrated into one processing module, each module may exist alone physically, or two or more modules may be integrated into one module. The integrated module may be implemented in a form of hardware, or may be implemented in a form of a software functional module. When the integrated modules are implemented in the form of the software functional module and sold or used as an independent product, the functions may be stored in a computer-readable storage medium. Based on such an understanding, the technical solutions of the present disclosure essentially, or a part contributing to a conventional technology, or all or some of the technical solutions may be implemented in the form of the software product.

The flowchart and block diagrams in the accompanying drawings show the system architecture, function, and operation of possible implementations of the systems, the methods, and the computer program products according to various embodiments of the present disclosure. In this regard, each block in the flowcharts or block diagrams may represent a module, a program segment, or a part of a code, and the module, the program segment, or the part of the code includes one or more executable instructions for implementing a specified logical function. It should also be noted that, in some alternative implementations, functions marked in the blocks may also occur in a sequence different from that marked in the accompanying drawings. For example, two blocks shown in succession may, in fact, be actually executed substantially in parallel, or sometimes may be executed in a reverse order, depending on a function involved. It should also be noted that each block of the block diagrams or flowcharts, and combinations of blocks in the block diagrams or flowcharts, can be implemented by special purpose hardware-based systems that perform the specified functions or operations, or by combinations of special purpose hardware and computer instructions.

It should be understood by those skilled in the art that features recited in various embodiments and/or claims of the present disclosure may be combined and/or incorporated in various ways, even if such combinations and/or incorporations are not explicitly recited in the present disclosure. Particularly, various combinations and/or incorporations of the features recited in the various embodiments and/or the claims of the present disclosure may be made without departing from the spirit and teachings of the present disclosure. All such combinations and/or incorporations are within the scope of the present disclosure.

While the present disclosure has been shown and described with reference to certain exemplary embodiments thereof, it should be understood by those skilled in the art that various changes in form and in details may be made without departing from the spirit and scope of the present disclosure as defined by the appended claims and their equivalents. Accordingly, the scope of the present disclosure should not be limited to the above embodiments, but should be defined not only by the appended claims, but also by equivalents of the appended claims.

What is claimed is:

1. A mask topology optimization method for surface plasmon near-field photolithography, comprising steps of:
    acquiring a first mask data and performing fuzzy processing and projection processing on the same to obtain a second mask data;
    performing forward calculation according to the second mask data and a preset surface plasmon near-field photolithography condition to obtain an imaging data and a forward field data;
    calculating an imaging error between the imaging data and an expected imaging data;
    performing adjoint calculation on the second mask data to obtain an adjoint field data;
    calculating a gradient matrix of the imaging error relative to the first mask data according to the forward field data and the adjoint field data; and
    updating the first mask data according to the gradient matrix, repeating the above steps for iteration calculation until the optimized mask data is obtained, and outputting a final mask pattern.

2. The mask topology optimization method for surface plasmon near-field photolithography according to claim 1, wherein the step of calculating an imaging error between the imaging data and expected imaging data comprises:
    determining whether the imaging error is less than a threshold or whether a current accumulated iteration number is greater than a set value, wherein if yes, the current mask data is output as the optimized mask data; otherwise, the iteration calculation is continued.

3. The mask topology optimization method for surface plasmon near-field photolithography according to claim 1, wherein the forward calculation comprises:
    simulating by using an exposure light source excitation source; and solving by using a finite-difference time-domain algorithm to obtain the imaging data and the forward field data.

4. The mask topology optimization method for surface plasmon near-field photolithography according to claim 1, wherein the adjoint calculation comprises:
   simulating by using an adjoint excitation source; and
   solving by using a finite-difference time-domain algorithm to obtain the adjoint field data.

5. The mask topology optimization method for surface plasmon near-field photolithography according to claim 1, wherein the step of acquiring a first mask data comprises:
   acquiring an initial mask pattern based on an expected imaging pattern;
   performing pixelation processing on the initial mask pattern to obtain an initial mask data and an expected imaging data; and
   taking the initial mask data or an updated mask data as the first mask data to perform the fuzzy processing and the projection processing.

6. The mask topology optimization method for surface plasmon near-field photolithography according to claim 1, wherein the fuzzy processing comprises:
   performing the fuzzy processing by using the following formula:

$$\tilde{\rho}(r) = \sum_{r_j} \frac{1}{\alpha} \rho(r) B(r, r_j)$$

wherein $\alpha = \sum_{r_j} B(r, r_j)$, $B(r, r_j) = \max\{0, R_{filt} - \|r - r_j\|\}$, $R_{filt}$ is a fuzzy radius, $\rho(r)$ is the initial mask data or the updated mask data, i.e., the first mask data, $\tilde{\rho}(r)$ is the mask data after the fuzzy processing, r is coordinate of any point in the current mask data, and $\Sigma_{r_j}$ represents the summation at the r coordinate by traversing all coordinate points $r_j$ in the current mask data.

7. The mask topology optimization method for surface plasmon near-field photolithography according to claim 1, wherein the projection processing comprises:
   performing binarization projection processing by using the following formula:

$$\overline{\rho}(r) = \begin{cases} \eta e^{\frac{\beta(\eta - \tilde{\rho}(r))}{\eta}} - (\eta - \tilde{\rho}(r))e^{-\beta}, & 0 \le \tilde{\rho}(r) \le \eta \\ 1 - (1 - \eta)e^{\frac{\beta(\tilde{\rho}(r) - \eta)}{\eta}} - (\eta - \tilde{\rho}(r))e^{-\beta}, & \eta < \tilde{\rho}(r) \le 1 \end{cases}$$

wherein $\beta$ is a binarized parameter, $\eta$ is a binarized threshold, $\tilde{\rho}(r)$ is the mask data after the fuzzy processing, and $\overline{\rho}(r)$ is mask data after the projection processing, i.e., the second mask data.

8. The mask topology optimization method for surface plasmon near-field photolithography according to claim 1, wherein the step of calculating an imaging error between the imaging data and expected imaging data comprises:
   calculating the imaging error F by using the following formula:

$$F = \sum |P_a(x, y) - P_d(x, y)|^2 / (m \times n) \times 100\%$$

wherein $P_a(x, y)$ is the imaging data corresponding to the current mask data under the preset surface plasmon near-field photolithography condition, $P_d(x, y)$ is the expected imaging data, (x, y) is coordinate in the imaging data, and m and n are numbers of sampling points in x and y directions corresponding to the imaging data.

9. The mask topology optimization method for surface plasmon near-field photolithography according to claim 8, wherein the step of calculating a gradient matrix of the imaging error relative to the first mask data according to the forward field data and the adjoint field data comprises:
   calculating the gradient matrix by using the following formula:

$$G(r) = \partial F / \partial \rho(r) = n(r) Re\{E_{for}(r) \cdot E_{adj}(r)\}$$

wherein G(r) is the gradient matrix, n(r) is refractive index distribution of the current mask data, $E_{for}(r)$ is the forward field data, and $E_{adj}(r)$ is the adjoint field data.

10. The mask topology optimization method for surface plasmon near-field photolithography according to claim 9, wherein the step of updating the first mask data according to the gradient matrix comprises:
    calculating the updated mask data by using the following formula:

$$\rho^{k+1}(r) = \rho^k(r) + s \cdot G(r)$$

wherein s is a preset optimization step size, $\rho^k(r)$ is the current mask data, $\rho^{k+1}(r)$ is the updated mask data, G(r) is the gradient matrix, and k is a current iteration number,
wherein all pixel values of the updated mask data are limited to a range of [0, 1], wherein the pixel values greater than 1 are set to 1, the pixel values less than 0 are set to 0, and the pixel values in the range of [0, 1] are kept unchanged.

11. The mask topology optimization method for surface plasmon near-field photolithography according to claim 1, wherein the step of outputting a final mask pattern comprises:
    outputting the current mask data as the optimized mask data, extracting an edge of the optimized mask data by using an edge smoothing method and removing pixelated jaggy, then outputting the final mask pattern, wherein the output optimized mask data is the current second mask data.

12. A mask topology optimization system for surface plasmon near-field photolithography, comprising:
    a mask processing module, configured to acquire a first mask data and perform fuzzy processing and projection processing on the same to obtain a second mask data;
    an acquisition module, configured to perform forward calculation according to the second mask data and a preset surface plasmon near-field photolithography condition to obtain an imaging data and a forward field data;
    an imaging error calculation module, configured to calculate an imaging error between the imaging data and an expected imaging data;
    an adjoint field data calculation module, configured to perform an adjoint calculation on the second mask data to obtain adjoint field data;

a gradient matrix calculation module, configured to calculate a gradient matrix of the imaging error relative to the first mask data according to the forward field data and the adjoint field data; and an iteration calculation module, configured to update the first mask data according to the gradient matrix, repeating the above steps for iteration calculation until the optimized mask data is obtained, and output a final mask pattern.

13. A computer-readable storage medium, having a computer program stored thereon, wherein the program, when executed by a processor, implements the mask topology optimization method for surface plasmon near-field photolithography according to of claim 1.

* * * * *